United States Patent [19]

Hayashi et al.

[11] Patent Number: 4,974,542
[45] Date of Patent: Dec. 4, 1990

[54] PHOTOCHEMICAL VAPOR REACTION APPARATUS

[75] Inventors: Shigenori Hayashi, Atsugi; Kenji Itoh, Machida, both of Japan

[73] Assignee: Semiconductor Energy Laboratory Co., Ltd., Atsugi, Japan

[21] Appl. No.: 190,355

[22] Filed: May 5, 1988

Related U.S. Application Data

[63] Continuation-in-part of Ser. No. 97,188, Jun. 16, 1987, Pat. No. 4,768,464.

[30] Foreign Application Priority Data

May 7, 1987 [JP] Japan ................................ 62-111949

[51] Int. Cl.$^5$ ............................................. C23C 16/48
[52] U.S. Cl. .................................... 118/722; 118/50.1
[58] Field of Search ...................... 118/50.1, 722, 723; 427/54.1; 156/345

[56] References Cited

U.S. PATENT DOCUMENTS

| 4,183,780 | 1/1980 | McKenna et al. | 118/722 X |
| 4,568,632 | 2/1986 | Blum et al. | 427/54.1 X |
| 4,718,974 | 1/1988 | Minaee | 427/54.1 X |
| 4,768,464 | 9/1988 | Hayashi et al. | 118/722 |

Primary Examiner—Evan Lawrence
Attorney, Agent, or Firm—Sixbey, Friedman, Leedom & Ferguson

[57] ABSTRACT

A photochemical vapor reaction apparatus wherein a silicon film is deposited by photo-CVD. The photo-CVD is implemented by irradiating a reactive gas with ultraviolet rays which are emitted from a mercury lamp. The emission of the mercury lamp becomes continuous when the frequency of input power is 20 KHz or higher. By virtue of such a continuous light, the deposition is implemented uniformly and a close-packed and hard film can be formed.

5 Claims, 3 Drawing Sheets

PHOTOCHEMICAL VAPOR REACTION APPARATUS

RELATED PATENT

This application is a continuation-in-part of application Ser. No. 97,188 filed Sept. 16, 1987, now U.S. Pat. No. 4,768,464.

BACKGROUND OF THE INVENTION

This invention relates to a photochemical reaction process and apparatus therefor.

High pressure mercury lamps and low pressure mercury lamps are known ultraviolet light sources which have been employed in the semiconductor manufacture field. Such a mercury lamp is capable of emitting ultraviolet rays by virtue of argon gas excited by an alternating electric power of the line frequency (50 Hz), the argon gas being disposed in the lamp at a pressure of several Torrs with a dopant gas of mercury.

FIG. 1 shows the relative energy level versus the frequency of ultraviolet rays emitted from an conventional mercury lamp. As shown in the diagram, the energy level is highest at 253.7 nm and the next high at 184.9 nm. However, the most useful ultraviolet rays in semiconductor manufacture are those having a wavelength of 184.9 nm which is effective to decompose silane ($Si_nH_{2n+2}$, n is a positive integer). For this reason, it is desired to enhance the emission at about 185 nm.

Further, in accordance with a conventional photo-CVD, ultraviolet rays are emitted through a glass window to irradiate a reactive gas together with a substrate to be processed so that the product of the CVD is deposited also on the inside surface of the window besides the substrate and reduces the transmission of the rays to the inside of the reaction chamber resulting in the deposition being stopped.

Still further, the emission from conventional lamps is necessarily intermittent as shown in FIGS. 2(A) and 2(B) and therefore the film eventually formed becomes non-uniform. In the figures are schematically illustrated the curves showing the applied current C and the corresponding applied voltage V.

SUMMARY OF THE INVENTION

It is therefore an object of the invention to provide a photochemical vapor reaction process and an apparatus therefor capable of implementing a uniform processing.

The inventors have found that it is possible to form uniform and high qualified films when a coutinuous ultraviolet light is used. In general, when an intermittent light is used, films deposited in the absence of light are formed soft and less dense while films deposited in the exsistence of light are formed highly dense and hard. Because of this, the films deposited by conventional systems necessasrily become nonuniform.

To accomplish the above and other objects, the present invention makes use of a high frequency electric power as the energy to cause the emission. The emission of light from a mercury lamp does not disappear immediately just after the input power is halted but continues for a certain time period because of the presence of excited mercury gas in the bulb of the mercury lamp. The emission from the excited mercury gas lasts for several scores of micro seconds, e.g. 50 micro seconds. From this fact, it is understood that the emission becomes continuous when the frequency of the input power is 20 KHz or higher.

DETAILED DESCRIPTION OF THE PREFERRED EMBODIMENTS

Figure 1:
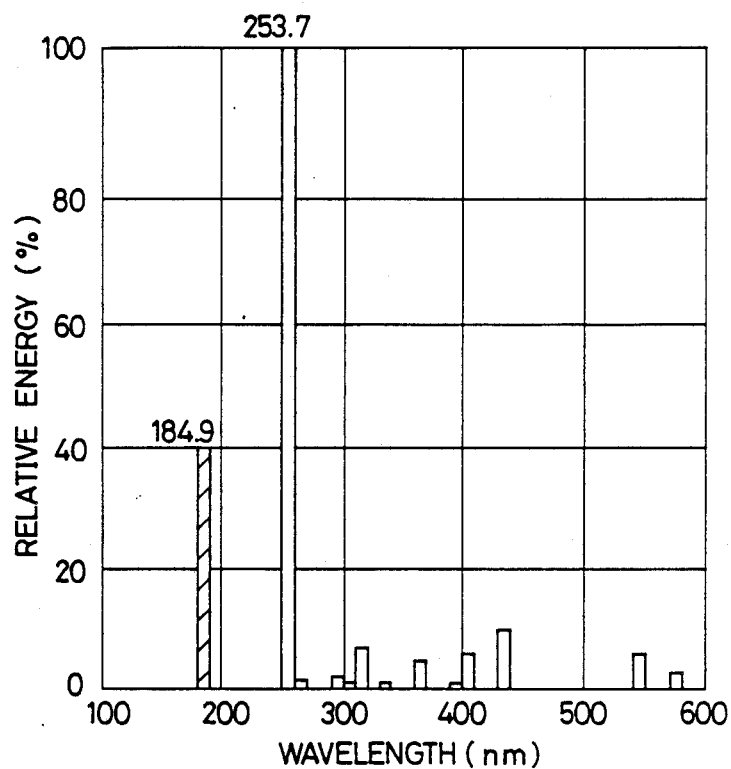
FIG. 1 is a graphical diagram showing relative energy levels of ultraviolet rays emitted from a prior art lamp.
Figure 2A:
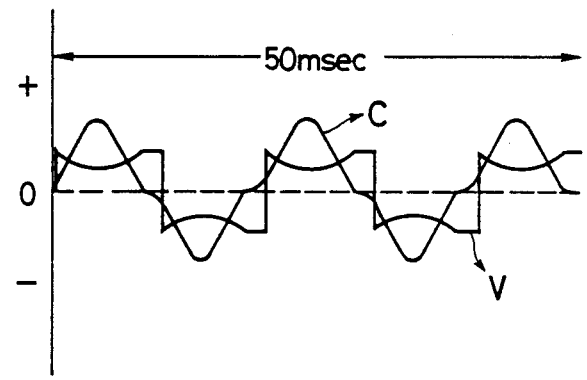
FIGS. 2(A) and 2(B) are graphical diagrams showing the relationship between the input voltage and current and the intensity of the emission in accordance with a prior art lamp.
Figure 2B:
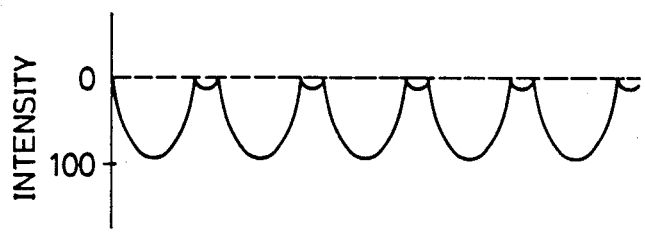
Figure 3:
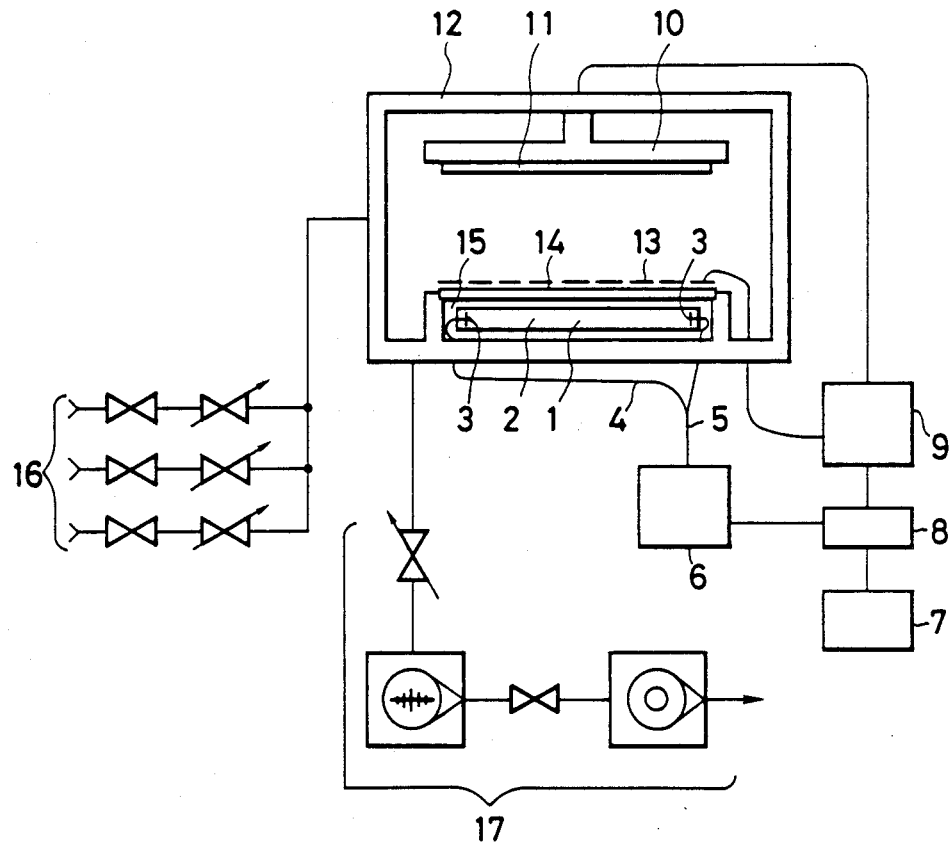
FIG. 3 is a schematic view showing a CVD apparatus in accordance with the present invention.

Referring to FIG. 3, a photo-CVD apparatus in accordance with the present invention is illustrated. In the figure, the apparatus is composed of a vacuum chamber 12, a substrate holder 10 on which a substrate is mounted in the upper position of the chamber 12, a light source chamber 15 is provided on the bottom of the vacuum chamber 12, a light window 14 partitioning the light source chamber 15 from the vacuum chamber 12, a gas feeding system 16, an evacuating system 17 and a light source such as a mercury lamp 1 filled with mercury gas and an inert gas in its inside 2 and provided with a pair of electrodes 3. Between the substrate holder 10 and a meshed electrode on the window 14 is supplied a 13.56 MHz electric power from a power source 7 through a switch 8 and a matching circuit 9. The mercury lamp 2 is supplied with a 13.56 MHz electric power (300 W) also from the power source 7 through a matching circuit 6 by turning over the switch 8.

Next, the deposition process using this apparatus will be described. A productive gas such as a silane gas is inputted to the vacuum chamber 12 from the gas feeding system 16 after evacuating the chamber 12. The productive gas is then irradiated with ultraviolet rays emitted from the mercury lamp 1, decomposed in the light of the ultraviolet rays and deposited on the substrate 11 as a silicon thin film. After removing the coated substrate 11 from the chamber 12, an undesirable deposition on the light window 14 is eliminated by plasma etching in advance of disposing another substrate anew. The etching is implemented by introducing an etchant gas into the vacuum chamber 12 and turning over the switch 8 to supply a power between the holder 10 and the meshed electrode 13. When oxygen gas is inputted as a constituent of the productive gas together with a monosilane gas diluted with an inert gas, a silicon oxide film can be deposited.

Figure 4A:
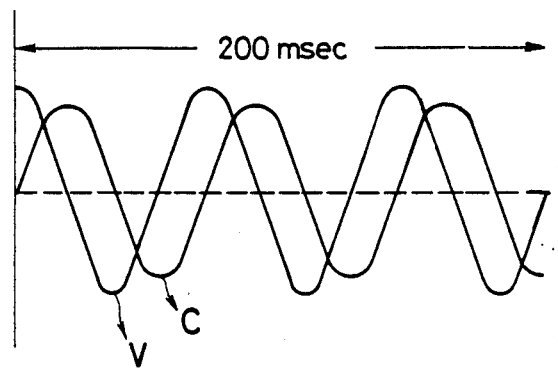
FIGS. 4(A) and 4(B) are graphical diagrams showing the relationship between the input voltage and current and the intensity of the emission in accordance with the present invention
Figure 4B:
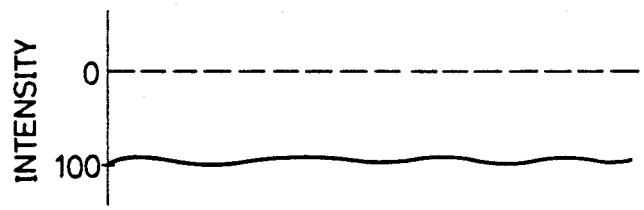
Figure 5:
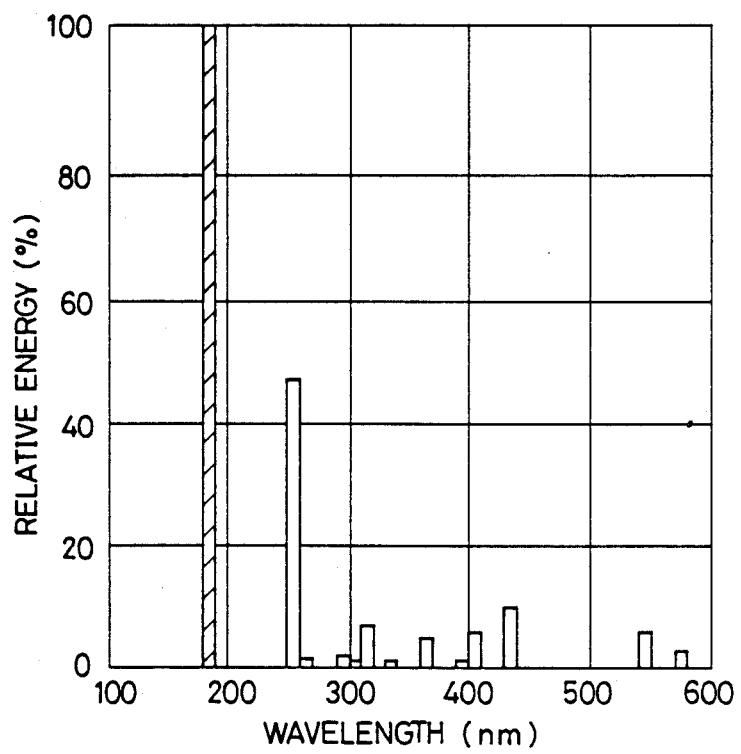
FIG. 5 is a graphical diagram showing relative energy levels of ultraviolet rays at several frequency points in accordance with the present invention.

The wave forms of the current C and the voltage V applied between the electrodes 3 and the intensity of the mercury lamp 1 are graphically illustrated in FIGS. 4(A) and 4(B). As shown in the figure, an irradiation continuous illumination is accomplished because of the frequency of 13.56 MHz instead of the line frequency. In accordance with experiments, continuous emission of light takes place by applying a power of 1 KHz to 2.45 GHz. Preferably, the frequency should not be lower than 20 KHz. FIG. 5 is a graphical diagram showing the intensity of ultraviolet rays at several frequency points. As shown in the diagram, the intensity is maximum at about 185 nm.

For comparison, silicon oxide films deposited in accordance with prior art and the present invention in the same condition other than the emission of ultraviolet rays were subjected to an etching process using an etchant of 10% HF. The etching speed depends on how highly close-packed that film is. How close that film is packed in turn depends on the uniformity of irradiation. The ratio of minimum to maximum of the intensity represents the uniformity of irradiation. When the frequency of the input power to a mercury lamp is 13.56 MHz, the ratio was 0.9. When the frequency of the input power to a mercury lamp is 100 KHz, the ratio was 0.5. In accordance with experiments, the relations between the ratio and the etching speed were: approx. 0: 5000–3000 A/min, less than 0.4: 3000–1500A/min, 0.5: 1000 A/min, between 0.5 and 0.9: 1000–500 A/min, 0.9 or higher: 500 A/min.

From these experiments, when the ratio is greater than 0.5, the etching speed becomes less than one third of the speed in the prior art case (approx.0). This means that the film deposited in accordance with the present invention become dense and uniform.

While a description has been made for several embodiments, the present invention should be limited only by the appended claims and should not be limited by the particular examples. What follows is an example of a modification and variation according to the invention. A high quality silicon nitride film can be formed using a silane and ammonia as a productive gas.

What is claimed is:

1. A photochemical vapor reaction apparatus comprising:
    a reaction chamber;
    a vacuum pump for evacuating said reaction chamber;
    a light source for irradiating the inside of said reaction chamber with a light;
    an electric power source for said light source; and
    a gas feeding system for inputting a reactive gas to said reaction chamber;
    wherein said power source is a high frequency power source capable of supplying alternating electric power at such a high frequency that the emission from said light source is continuous.

2. The apparatus of claim 1 wherein said light source is an ultraviolet light source.

3. The apparatus of claim 2 wherein said ultraviolet light source is a mercury lamp.

4. The apparatus of claim 3 wherien the frequency of the input power to said mercury lamp is 20 KHz or higher.

5. The apparatus of claim 4 wherein said frequency is 13.56 MHz.

* * * * *